United States Patent
Anderson et al.

(10) Patent No.: US 8,237,233 B2
(45) Date of Patent: *Aug. 7, 2012

(54) FIELD EFFECT TRANSISTOR HAVING A GATE STRUCTURE WITH A FIRST SECTION ABOVE A CENTER PORTION OF THE CHANNEL REGION AND HAVING A FIRST EFFECTIVE WORK FUNCTION AND SECOND SECTIONS ABOVE EDGES OF THE CHANNEL REGION AND HAVING A SECOND EFFECTIVE WORK FUNCTION

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 266 days.

This patent is subject to a terminal disclaimer.

(21) Appl. No.: 12/194,039

(22) Filed: Aug. 19, 2008

(65) Prior Publication Data

US 2010/0044801 A1    Feb. 25, 2010

(51) Int. Cl.
  *H01L 29/51* (2006.01)
  *H01L 29/78* (2006.01)
(52) U.S. Cl. ........ 257/407; 257/409; 257/411; 257/413; 257/E29.04
(58) Field of Classification Search .................. 257/372, 257/394–397, 405–407, 409, 411, 413
See application file for complete search history.

(56) References Cited

U.S. PATENT DOCUMENTS

| | | | |
|---|---|---|---|
| 3,855,610 A | | 12/1974 | Nagata et al. |
| 4,962,409 A | | 10/1990 | Solomon |
| 5,937,303 A | * | 8/1999 | Gardner et al. ............... 438/305 |
| 5,998,848 A | | 12/1999 | Brown et al. |
| 6,097,069 A | * | 8/2000 | Brown et al. ................. 257/374 |
| 6,100,143 A | * | 8/2000 | Brown et al. ................. 438/296 |
| 6,653,698 B2 | | 11/2003 | Lee et al. |
| 6,830,953 B1 | | 12/2004 | Hu et al. |
| 6,949,769 B2 | | 9/2005 | Hu et al. |
| 7,084,024 B2 | | 8/2006 | Gluschenkov et al. |
| 7,151,023 B1 | | 12/2006 | Nayfeh et al. |
| 2001/0002058 A1 | * | 5/2001 | Nakamura ..................... 257/510 |
| 2003/0068874 A1 | * | 4/2003 | Jung et al. ..................... 438/585 |
| 2005/0040404 A1 | | 2/2005 | Hu et al. |

(Continued)

FOREIGN PATENT DOCUMENTS

JP    59181063 A1    10/1984

(Continued)

*Primary Examiner* — Anh Mai
(74) *Attorney, Agent, or Firm* — Gibb & Riley, LLC; Richard M. Kotulak, Esq.

(57) ABSTRACT

In view of the foregoing, disclosed herein are embodiments of an improved field effect transistor (FET) structure and a method of forming the structure. The FET structure embodiments each incorporate a unique gate structure. Specifically, this gate structure has a first section above a center portion of the FET channel region and second sections above the channel width edges (i.e., above the interfaces between the channel region and adjacent isolation regions). The first and second sections differ (i.e., they have different gate dielectric layers and/or different gate conductor layers) such that they have different effective work functions (i.e., a first and second effective work-function, respectively). The different effective work functions are selected to ensure that the threshold voltage at the channel width edges is elevated.

5 Claims, 7 Drawing Sheets

U.S. PATENT DOCUMENTS

2006/0071282 A1 4/2006 Kadoshima et al.
2009/0242985 A1* 10/2009 Anderson et al. ............. 257/347
2009/0243029 A1* 10/2009 Anderson et al. ............. 257/506
2010/0038728 A1* 2/2010 Anderson et al. ............. 257/410

FOREIGN PATENT DOCUMENTS

JP 07094733 A1 9/1993
JP 2004-303911 * 10/2004

* cited by examiner

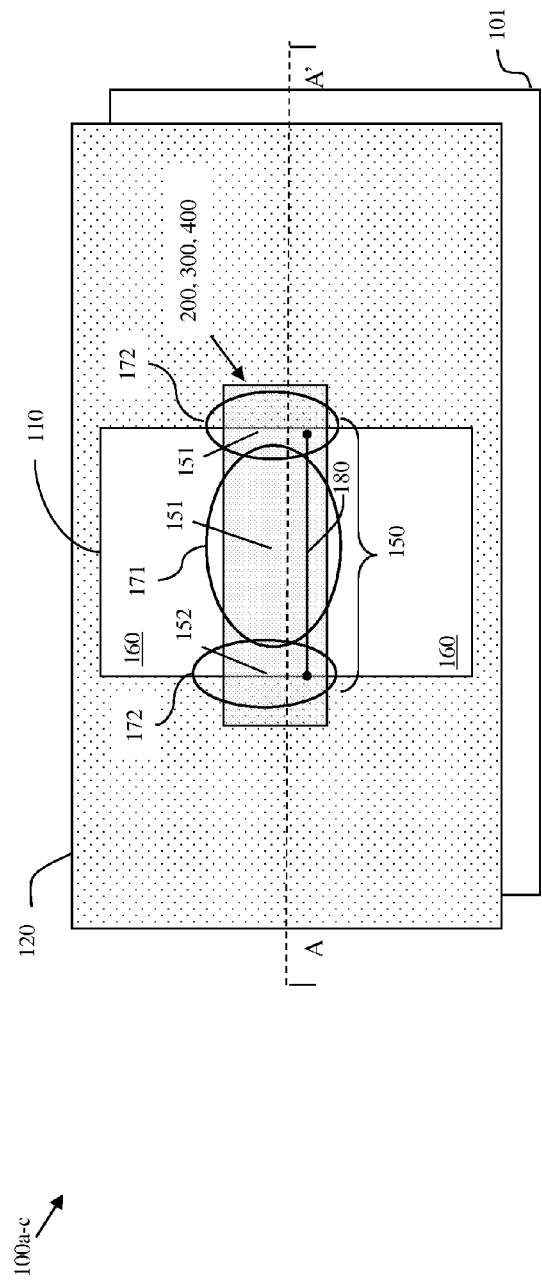
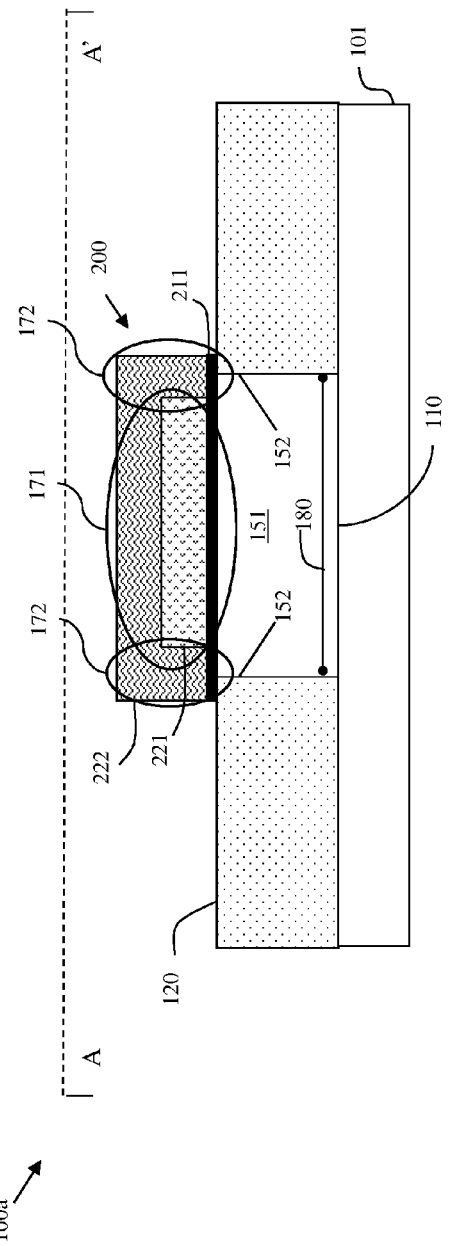
Figure 1
Figure 2

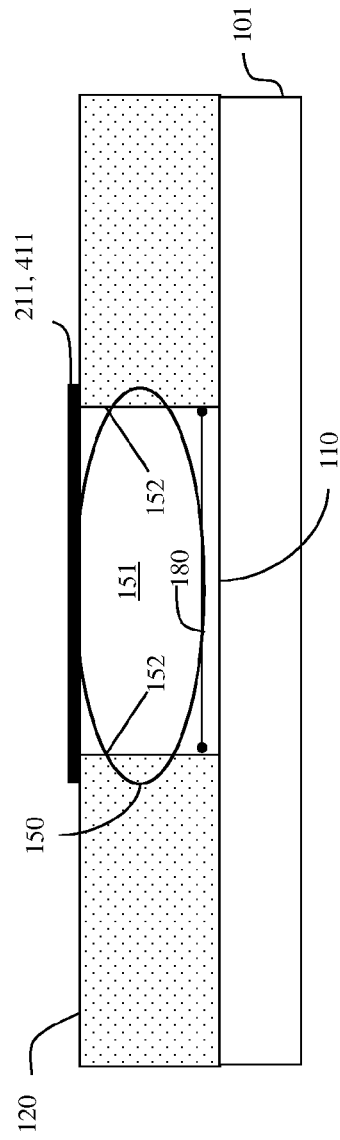
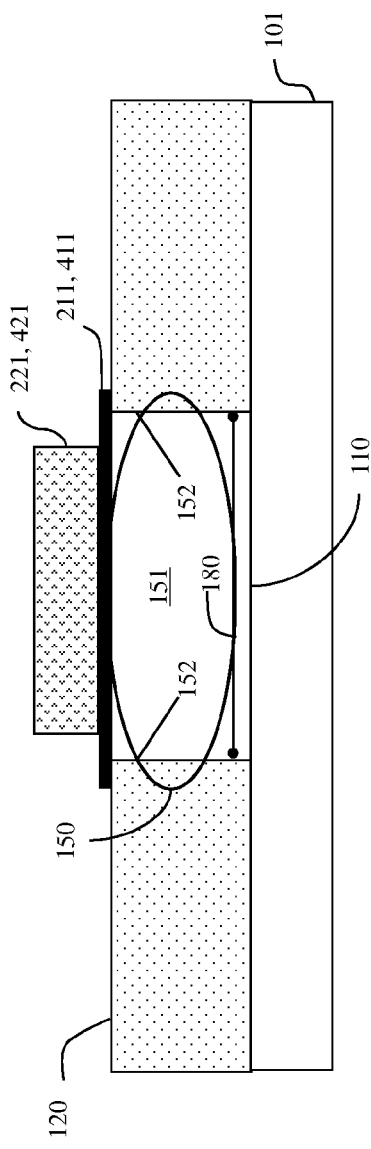

FIELD EFFECT TRANSISTOR HAVING A GATE STRUCTURE WITH A FIRST SECTION ABOVE A CENTER PORTION OF THE CHANNEL REGION AND HAVING A FIRST EFFECTIVE WORK FUNCTION AND SECOND SECTIONS ABOVE EDGES OF THE CHANNEL REGION AND HAVING A SECOND EFFECTIVE WORK FUNCTION

BACKGROUND

1. Field of the Invention

The embodiments of the invention generally relate to complementary metal oxide semiconductor body (CMOS) devices and, more specifically, to a CMOS structure and method of forming the CMOS structure with dual metal gates to suppress corner leakage.

2. Description of the Related Art

As complementary metal oxide semiconductor (CMOS) devices are scaled in size, conventional gate stack structures are being replaced by metal gate stack structures. Specifically, a conventional gate stack structure typically includes a thin silicon oxide ($SiO_2$) gate dielectric layer and a doped-polysilicon gate conductor layer. Unfortunately, doped polysilicon gate conductor layers are subject to depletion effects. These depletion effects result in an increase in the effective gate dielectric layer thickness and, thereby limit device scaling. Thus, high k dielectric layer-metal gate conductor layer stacks with different work functions for N-type field effect transistors (NFETs) and p-type field effect transistors, have been introduced. These stacks are improvements over the conventional gate structures in that the high k-dielectric layer minimizes leakage current and the metal gate conductor layer is not subject to depletion effects. However, with ever narrower channel widths new concerns for future CMOS technology generations and, more particularly, for CMOS technology generations at or beyond the 65 nm node are introduced even with such high-k dielectric layer-metal gate conductor layer stacks.

SUMMARY

One embodiment of the field effect transistor of the present invention comprises a substrate. A semiconductor body is positioned on the substrate. This semiconductor body comprises a channel region with a sidewall and a center portion. An isolation region is also on the substrate positioned laterally adjacent to the sidewall. A gate structure traverses the width of the channel region and further extends laterally beyond the sidewall onto the isolation region. This gate structure comprises a first section on the semiconductor body above the center portion of the channel region and a second section above the semiconductor body sidewall (i.e., above the interface between the semiconductor body and the isolation region). This second section is different from the first section. Specifically, the first and second sections differ such that they have different effective work functions (i.e., a first and second effective work-function, respectively). For example, the first section can have a first gate conductor layer and the second section can have a second gate conductor layer that is different from the first gate conductor layer and, more particularly, that has a different work function than the first gate conductor layer. Alternatively, the first section can have a first gate dielectric layer and the second section can have a second gate dielectric layer that is different from the first gate dielectric layer and, particularly, that has a different fixed charge content than the first gate dielectric layer, thereby resulting in different effective work functions in the first and second sections.

Another embodiment of the field effect transistor of the present invention comprises a substrate. A semiconductor body is positioned on the substrate. This semiconductor body comprises a channel region with a sidewall and a center portion. An isolation region is also on the substrate positioned laterally adjacent to the sidewall. A gate structure traverses the width of the channel region and further extends laterally beyond the sidewall onto the isolation region. This gate structure comprises a first section on the semiconductor body above the center portion of the channel region and a second section above the semiconductor body sidewall (i.e., above the interface between the semiconductor body and the isolation region). This second section is different from the first section. Specifically, in this embodiment the first and second sections have both different gate dielectric layers and different gate conductor layers such that the first section has a first effective work-function and the second section has a second effective work function that is different from the first effective work-function.

One embodiment of the field effect transistor formation method of the present invention comprises providing a substrate. On that substrate, a semiconductor body is formed. Additionally, an isolation region is formed on the substrate such that it is positioned laterally adjacent to a sidewall of the semiconductor body. Next, a gate structure is formed such that it traverses the width of a channel region of the semiconductor body and further such that it extends laterally beyond the sidewall of the semiconductor body onto the isolation region. This gate structure is specifically formed with a first section, having a first effective work-function, above a center portion of the channel region and with a second section, having a second effective work function different from the first effective work-function, above the sidewall (i.e., above the interface between the isolation region and the semiconductor body). This process of forming the gate structure can, for example, comprise forming the first section with a first gate conductor layer and the second section with a second gate conductor layer that is different from the first gate conductor layer (i.e., that has a different work function than the first gate conductor layer). Alternatively, this process of forming the gate structure can comprise forming the first section with a first gate dielectric layer and the second section can have a second gate dielectric layer that is different from the first gate dielectric layer and, particularly, that has a different fixed charge content than the first gate dielectric layer so that the resulting first and second sections have different effective work functions.

Another embodiment of the field effect transistor formation method of the present invention comprises providing a substrate. On that substrate, a semiconductor body is formed. Additionally, an isolation region is formed on the substrate such that it is positioned laterally adjacent to a sidewall of the semiconductor body. Next, a gate structure is formed such that it traverses the width of a channel region of the semiconductor body and further such that it extends laterally beyond the sidewall of the semiconductor body onto the isolation region. This gate structure is specifically formed with a first section, having a first effective work-function, above a center portion of the channel region and with a second section, having a second effective work function different from the first effective work-function, above the sidewall (i.e., above the interface between the isolation region and the semiconductor body). In this embodiment, the process of forming the gate structure can, for example, comprise forming the first and second sections with both different gate dielectric layers and different gate conductor layers.

BRIEF DESCRIPTION OF THE SEVERAL VIEWS OF THE DRAWINGS

The embodiments of the invention will be better understood from the following detailed description with reference to the drawings, which are not necessarily drawing to scale and in which:

FIG. 1 is a top view diagram illustrating the embodiments 100a-c of the field effect transistor;

FIG. 2 is a cross-section diagram illustrating one embodiment 100a of the field effect transistor;

FIG. 8 is a cross-section diagram illustrating a partially completed field effect transistor, as illustrated in FIG. 2 and FIG. 4;

FIG. 9 is a cross-section diagram illustrating a partially completed field effect transistor, as illustrated in FIG. 2 and FIG. 4;

DETAILED DESCRIPTION

Figure 3:
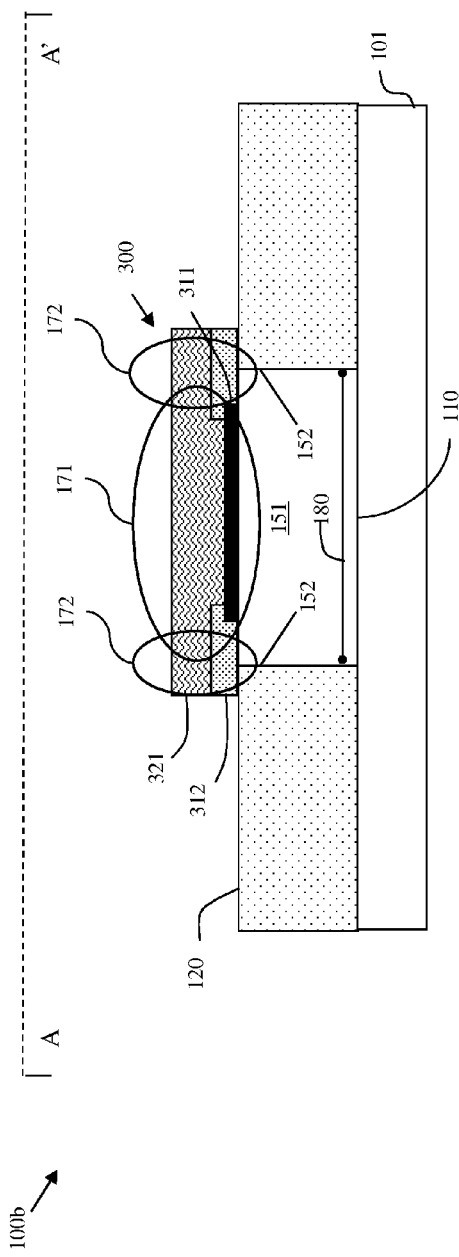
FIG. 3 is a cross-section diagram illustrating another embodiment 100b of the field effect transistor.

The embodiments of the invention and the various features and advantageous details thereof are explained more fully with reference to the non-limiting embodiments that are illustrated in the accompanying drawings and detailed in the following description.

As mentioned above, complementary metal oxide semiconductor body (CMOS) devices are scaled in size, conventional gate stack structures are being replaced by metal gate stack structures. Specifically, a conventional gate stack structure typically includes a thin silicon oxide ($SiO_2$) gate dielectric layer and a doped-polysilicon gate conductor layer. Unfortunately, doped polysilicon gate conductor layers are subject to depletion effects. These depletion effects result in an increase in the effective gate dielectric layer thickness and, thereby limit device scaling. Thus, high k dielectric layer-metal gate conductor layer stacks have been introduced. These stacks are improvements over the conventional gate structures in that the high k-dielectric layer minimizes leakage current and the metal gate conductor layer is not subject to depletion effects. However, with ever narrower channel widths new concerns for future CMOS technology generations and, more particularly, for CMOS technology generations at or beyond the 65 nm node are introduced even with such high-k dielectric layer-metal gate conductor layer stacks. Specifically, narrow channel width edge effects (e.g., decreases in threshold voltage (Vt) at the channel region sidewalls relative to the center portion of the channel region and also corner parasitic currents) can degrade power-performance optimization of technologies. Therefore, there is a need in the art for a field effect transistor (FET) structure that compensates for such narrow channel width edge effects and, more particularly, a FET structure that elevates the threshold voltage at the channel width edges and prevents current leakage.

In view of the foregoing, disclosed herein are embodiments of an improved field effect transistor (FET) structure and a method of forming the structure. The FET structure embodiments each incorporate a unique gate structure. Specifically, this gate structure has a first section above a center portion of the FET channel region and second sections above the channel width edges (i.e., above the interfaces between the channel region and adjacent isolation regions). The first and second sections differ (i.e., they have different gate dielectric layers and/or different gate conductor layers) such that they have different effective work functions (i.e., a first and second effective work-function, respectively). The different effective work functions are selected to ensure that the threshold voltage at the channel width edges is elevated.

More particularly, referring to FIG. 1, each of the embodiments of the field effect transistor 100a-c of the present invention comprises a substrate 101. The substrate 101 can, for example, comprise bulk silicon wafer or silicon-on-insulator (SOI) wafer. A semiconductor body 110 (e.g., a patterned single crystalline silicon layer) can be positioned on the substrate 101. This semiconductor body 110 can comprise source/drain regions 160 and a channel region 150 between the source/drain regions 160. The channel region 150 can have sidewalls 152 and a center portion 151. Isolation regions 120 can also be positioned on the substrate 101. Specifically, these isolation regions 120 can be positioned laterally immediately adjacent to the semiconductor body 110 and, more particularly, immediately adjacent to the sidewalls 152 of the semiconductor body channel region 150. The isolation regions 120 can, for example, comprise shallow trench isolation (STI) regions filled with suitable isolation material(s) (e.g., $SiO_2$).

A gate structure (200, 300 or 400, depending upon the embodiment) traverses the width 180 of the channel region 150 and further extends laterally beyond the sidewalls 152 onto the isolation regions 120. This gate structure 200, 300, 400 comprises a first section 171 on the semiconductor body 110 above the center portion 151 of the channel region 150 and second sections 172 above the semiconductor body sidewalls 152 (i.e., above the interfaces between the semiconductor body 110 and the isolation regions 120). The different embodiments of the field effect transistor of the present invention vary with respect to this gate structure (e.g., see gate structure 200 of FIG. 2, gate structure 300 in FIG. 3 and the gate structure 400 in FIG. 4). However, in each of the embodiments, the second sections 172 are different from the first section 171. Specifically, the first and second sections 171-172 are configured differently such that they have different effective work functions (i.e., a first and second effective work-function, respectively) in order to ensure that the threshold voltage of the channel region 150 at the sidewalls 152 (i.e., at the channel width edges) is at least equal to threshold voltage at the center portion 151 of the channel region 150. The different effective work functions are accomplished through the use of different gate conductor layers and/or different gate dielectric layers in the different sections 171-172.

Referring to FIG. 2 in combination with FIG. 1, in one embodiment 100a the gate structure 200 comprises a single gate dielectric layer 211 that traverses the width 180 of the channel region 150 of the semiconductor body 110. This gate dielectric layer 211 further extends laterally beyond the channel region sidewalls 152 onto the isolation regions 120. Thus, both the first and second sections 171 and 172 of the gate structure comprise the same gate dielectric layer 211. This gate dielectric layer 211 can comprise a high-k dielectric material.

The first section 171 can further comprise a first gate conductor layer 221 on the gate dielectric layer 211 above the center portion 151 of the channel region 150. The second sections 172 can each further comprise a second gate conductor layer 222 on the gate dielectric layer 211 above a corresponding sidewall 152. The first gate conductor layer 221 and the second gate conductor layer 222 comprise different conductive materials with different work functions.

For example, the first gate conductor layer 221 can comprise a first metal and the second gate conductor layer 222 can comprise a second metal that is different from the first metal and, more particularly, that has a different work function from the first metal. Given the formation techniques, discussed in detail below, the first gate conductor layer 221 can further comprise a layer of the second metal above the first metal. Those skilled in the art will recognize that the effective work function of this first gate conductor layer 221 will be determined largely based on the first metal closest to the gate dielectric layer 211. In the case of an n-type field effect transistor (NFET), the first metal of the first gate conductor layer 221 can comprise an n-type metal or n-type metal alloy and the second metal of the second gate conductor layer 222 can comprise a p-type metal or p-type metal alloy. In the case of a p-type field effect transistor (PFET), the first metal of the first gate conductor layer 221 can comprise a p-type metal or p-type metal alloy and the second metal of the second gate conductor layer 222 can comprise an n-type metal or n-type metal alloy.

In another example, the first gate conductor layer 221 can comprise a metal and the second gate conductor layer 222 can comprise a doped polysilicon that has a different work function than the metal. Again, given the formation techniques, discussed in detail below, the first gate conductor layer 221 can further comprise a layer of the doped polysilicon above metal. Those skilled in the art will recognize that the effective work function of this first gate conductor layer 221 will be determined largely based on the metal closest to the gate dielectric layer 211. In the case of an NFET, the metal of the first gate conductor layer 221 can comprise an n-type metal or n-type metal alloy and the polysilicon of the second gate conductor layer 222 can be doped with a p-type dopant (e.g., boron (B)). In the case of a p-type field effect transistor (PFET), the metal of the first gate conductor layer 221 can comprise a p-type metal or p-type metal alloy and the polysilicon of the second gate conductor layer 222 can be doped with an n-type dopant (e.g., phosphorous, antimony or arsenic).

Referring to FIG. 3 in combination with FIG. 1, in another embodiment 100b the first section 171 of the gate structure 300 comprise a first gate dielectric layer 311 on the semiconductor body 110 only above the center portion 151 of the channel region 150. The second sections 171 of the gate structure 300 each comprise a second gate dielectric layer 312 above a corresponding sidewall 152. That is, in a given second section 172, the second gate dielectric layer 312 is positioned above the channel sidewall 152 (i.e., above the semiconductor body 110-isolation region 120 interface) such that is positioned on both the isolation region 120 and edge portions of the channel region 150. These first and second gate dielectric layers 311-312 can be different gate dielectric materials with different fixed charge contents and, optionally, can have different gate dielectric layer thicknesses, thereby resulting in different effective work functions in the first and second sections 171-172. For example, the first gate dielectric layer 311 can comprise a first high-k dielectric material and the second gate dielectric layer 312 can comprise a second high-k dielectric material different from the first high-k dielectric material and having a different fixed charged content than the first high-k dielectric material. Additionally, the first gate dielectric layer 311 can have a first thickness and the second gate dielectric layer 312 can have a second thickness that is different from the first thickness (e.g., that is greater than the first thickness, as illustrated).

The gate structure 300 can further comprise a single metal gate conductor layer 321 that is positioned above the first gate dielectric layer 311 traversing the width 180 of the channel region 150 of the semiconductor body 110 and that is further positioned above the second gate dielectric layer 312 extending laterally beyond the channel region sidewalls 152 above the isolation regions 120. In the case of an NFET, the metal of this single gate conductor layer 321 can comprise an n-type metal or n-type metal alloy, whereas in the case of PFET, the metal of this single gate conductor layer 321 can comprise a p-type metal or p-type metal alloy.

Figure 4:
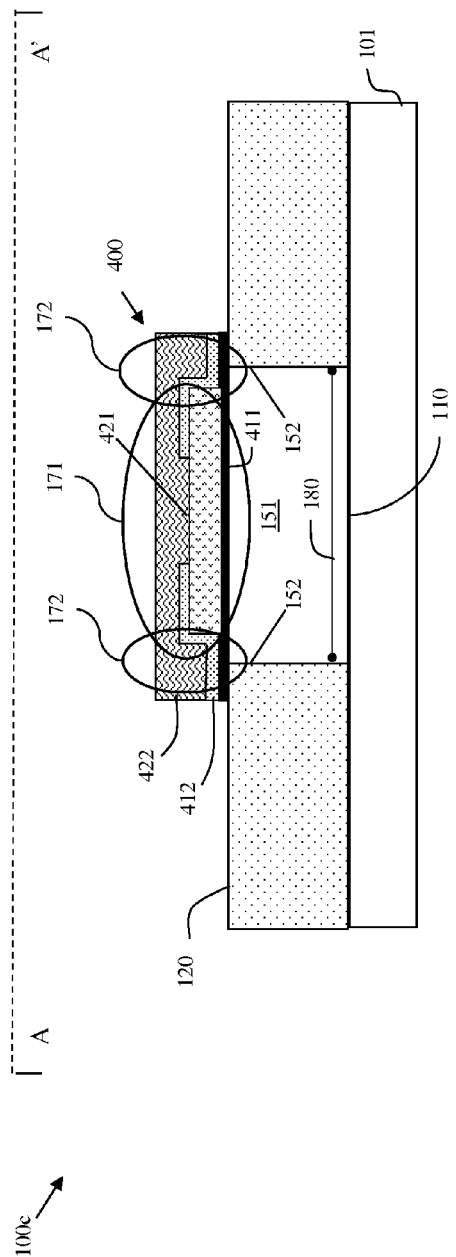
FIG. 4 is a cross-section diagram illustrating yet another embodiment 100c of the field effect transistor.

Referring to FIG. 4, in yet another embodiment 100c, the first section 171 of the gate structure 400 can comprise a first gate dielectric layer 411 above the center portion 152 of the channel region 150 and a first gate conductor layer 421 on the first gate dielectric layer 411. The second sections 172 of the gate structure 400 can each comprise a second gate dielectric layer 412 above a corresponding sidewall 152 and a second gate conductor layer 422 above the second gate dielectric layer 412.

In this embodiment 100c as with the first embodiment 100a illustrated in FIG. 2, the first gate conductor layer 421 and the second gate conductor layer 422 can comprise different conductive materials that have different work functions.

For example, the first gate conductor layer 421 can comprise a first metal and the second gate conductor layer 422 can comprise a second metal that is different from the first metal and, more particularly, that has a different work function from the first metal. Given the formation techniques, discussed in detail below, the first gate conductor layer 421 can further comprise a layer of the second metal above the first metal. Those skilled in the art will recognize that the effective work function of this first gate conductor layer 421 will be determined largely based on the first metal closest to the gate dielectric layer 411. In the case of an n-type field effect transistor (NFET), the first metal of this first gate conductor layer 421 can comprise an n-type metal or n-type metal alloy and the second metal of the second gate conductor layer 422 can comprise a p-type metal or p-type metal alloy. In the case of a p-type field effect transistor (PFET), the first metal of the first gate conductor layer 421 can comprise a p-type metal or p-type metal alloy and the second metal of the second gate conductor layer 422 can comprise an n-type metal or n-type metal alloy.

In another example, the first gate conductor layer 421 can comprise a metal and the second gate conductor layer 422 can comprise a doped polysilicon that has a different work function than the metal. Given the formation techniques, discussed in detail below, the first gate conductor layer 421 can further comprise a layer of doped polysilicon above the metal. Those skilled in the art will recognize that the effective work function of this first gate conductor layer 421 will be determined largely based on the metal closest to the gate dielectric layer 411. In the case of an NFET, the metal of the first gate conductor layer 421 can comprise an n-type metal or n-type metal alloy and the polysilicon of the second gate conductor layer 422 can be doped with a p-type dopant (e.g., boron (B)). In the case of a p-type field effect transistor (PFET), the metal of the first gate conductor layer 421 can comprise a p-type metal or p-type metal alloy and the polysilicon of the second gate conductor layer 422 can be doped with an n-type dopant (e.g., phosphorous, antimony or arsenic).

Additionally, in this embodiment 100c the first gate dielectric layer 411 and the second gate dielectric layer 412 comprise different dielectric materials with different fixed charge contents and, optionally, with different thicknesses, resulting in different effective work functions. For example, the first gate dielectric layer 411 can comprise a first high-k dielectric material and the second gate dielectric layer 412 can comprise a second high-k dielectric material different from the first high-k dielectric material and having different fixed charge content than the first high-k dielectric material. Additionally, the first gate dielectric layer 411 can have a first thickness and the second gate dielectric layer 412 can have a second thickness that is different from the first thickness (e.g., that is greater than the first thickness, as illustrated). It should be noted that given the formation techniques, described in detail below, the second gate dielectric layer 412 can further comprise a layer of the first high-k dielectric material below the second high-k dielectric material. That is, the first high-k dielectric material of the first gate dielectric layer 411 can extend laterally beyond the sidewalls 152 onto the isolation region 120 and the second high-k dielectric material can be formed above. Thus, the second gate dielectric layer 412 can comprise several layers of different types of high-k dielectrics.

Figure 5:
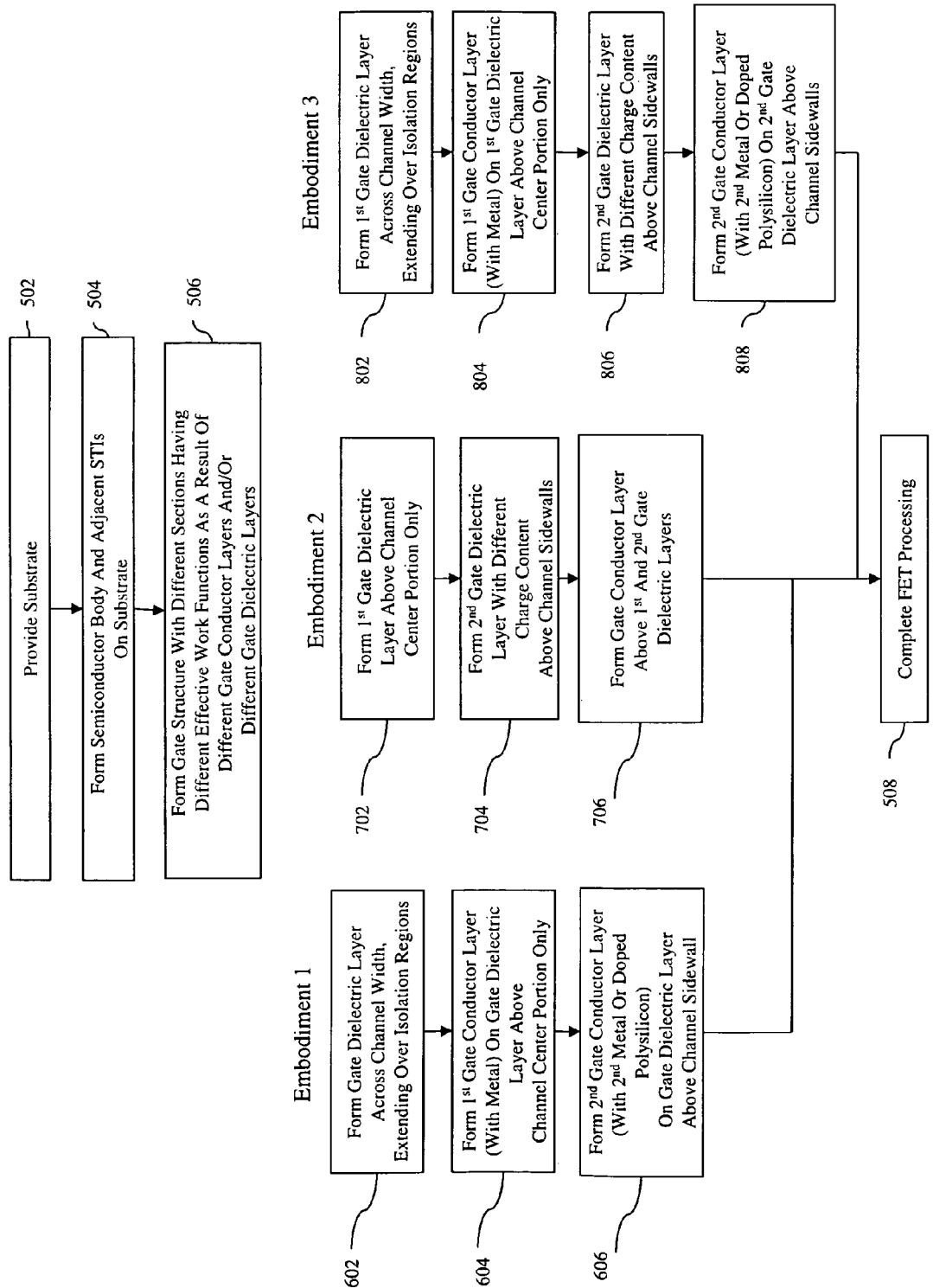
FIG. 5 is a flow diagram illustrating the embodiments of the method of the present invention.
Figure 6:
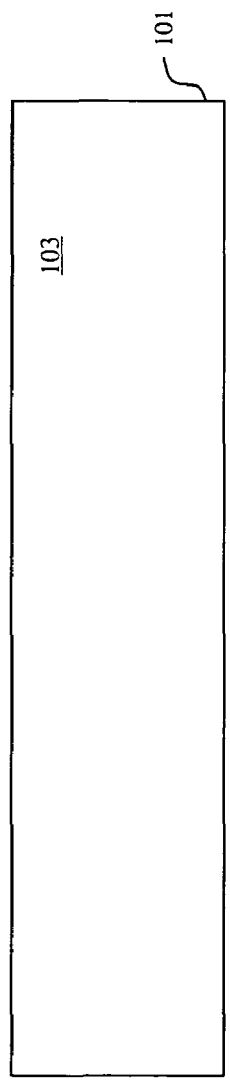
FIG. 6 is a cross-section diagram illustrating a partially completed field effect transistor, as illustrated in FIGS. 1-4.

Referring to FIG. 5, also disclosed are method embodiments for forming the above-described field effect transistor embodiments. The method embodiments comprise providing a substrate 101, such as a bulk silicon or silicon-on-insulator (SOI) wafer (502, see FIG. 6).

Figure 7:
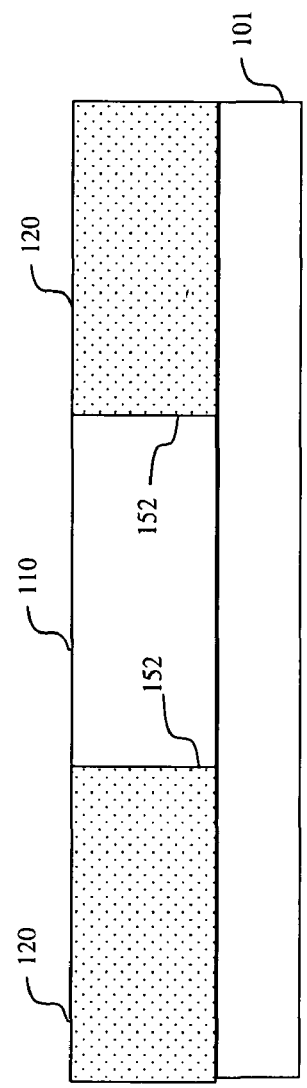
FIG. 7 is a cross-section diagram illustrating a partially completed field effect transistor, as illustrated in FIGS. 1-4.

Then, a semiconductor body 110 and isolation regions 120 are formed on the substrate 101 such that the isolation regions 120 are positioned laterally adjacent to the sidewalls 152 of the semiconductor body 110 (504, see FIG. 7). For example, shallow trench isolation (STI) regions 120 can be formed in the semiconductor material 103 (e.g., single crystalline silicon) at the top surface of the substrate 101, using conventional STI processing techniques, such that a remaining portion of the semiconductor material 103 creates the semiconductor body 110.

Next, a gate structure 200, 300, 400 is formed that traverses the width 180 of a designated channel region 150 of the semiconductor body 110 and further that extends laterally beyond the sidewalls 152 onto the isolation regions 120 (506, see FIG. 1). This gate structure 200, 300, 400 is specifically formed with a first section 171, having a first effective work-function, above a center portion 151 of the channel region 150 and with a second section 172, having a second effective work function different from the first effective work-function, above the sidewalls 152 in the channel region 150 (i.e., above the channel width edges at the interface between the semiconductor body 110 and the isolation regions 120). The first effective work-function of the first section 151 and the different second effective work function of the second section 152 ensure that the threshold voltage of the channel region 150 at the sidewalls 152 (and particularly at the channel width corners) is at least equal to the threshold voltage in the center portion 151 of the channel region 150. To accomplish this several different method embodiments are disclosed.

In one embodiment of the method, a gate dielectric layer 211 is formed that traverses the width 180 of the designated channel region 150 and further extends laterally beyond the channel sidewalls 152 onto the isolation regions 120 (602, see FIG. 8). Specifically, a high-k dielectric material can be deposited over the semiconductor body 110 and isolation regions 120. Then, a first gate conductor layer 221 is formed on the gate dielectric layer 211 and, more particularly, just above the center portion 151 of the channel region 150 (604, see FIG. 9). Next, a second gate conductor layer 222, which is different from the first gate conductor layer 221, is formed on the gate dielectric layer 221 above the channel sidewalls 152 (606, see FIG. 2).

Specifically, the processes 604-606 can comprise depositing a metal onto the gate dielectric layer 211. In the case of an NFET, this metal can comprise an n-type metal or n-type metal alloy, whereas in the case of PFET, this metal can comprise a p-type metal or p-type metal alloy. This metal is then lithographically patterned such that is remains only above the channel center portion 151 (see item 221 of FIG. 9). Next, a second metal, which has a different work function than the first metal, is deposited. For example, in the case of an NFET, this second metal can comprise a p-type metal or p-type metal alloy, whereas in the case of PFET, this second metal can comprise an n-type metal or n-type metal alloy (as discussed above). Alternatively, instead of depositing a second metal, a polysilicon material can be deposited. This polysilicon material can be either appropriately doped at deposition or subsequently implanted with appropriate dopants such that it has a different work function than the previously deposited metal. For example, in the case of an NFET, this polysilicon can be doped with a p-type dopant (e.g., boron (B)), whereas in the case of PFET, this polysilicon can be doped with an n-type dopant (e.g., phosphorous (P), arsenic (As) or antimony (Sb)). The second metal (or doped polysilicon) is then lithographically patterned such that it traverses the metal above the channel center portion 151 and further such that it extends laterally beyond the channel sidewalls 152 onto the portion of the gate dielectric layer 211 exposed above the isolation regions 120 (see item 222 in FIG. 2).

Figure 10:
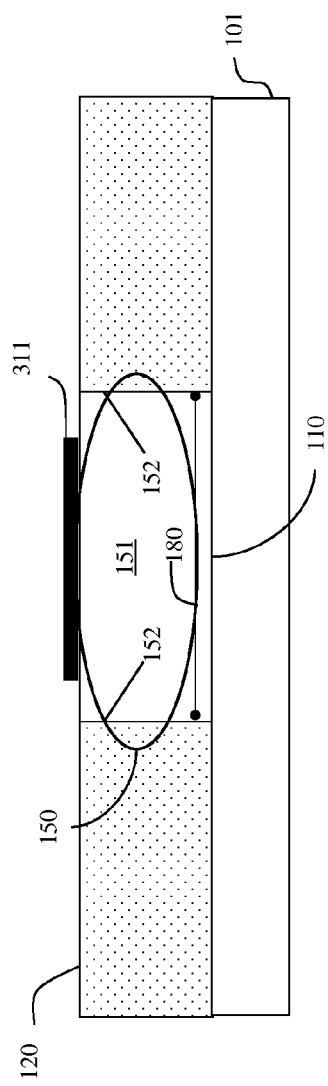
FIG. 10 is a cross-section diagram illustrating a partially completed field effect transistor, as illustrated in FIG. 3.
Figure 11:
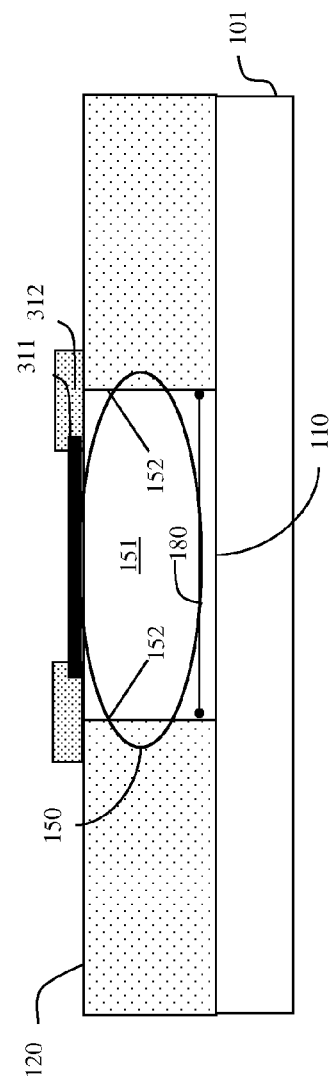
FIG. 11 is a cross-section diagram illustrating a partially completed field effect transistor, as illustrated in FIG. 3.

In another embodiment of the method, a first gate dielectric layer 311 is formed above the center portion 151 of the channel region 150 only (702, see FIG. 10). Next, a second gate dielectric layer 312 is formed above the channel sidewalls 152 adjacent to the first gate dielectric layer 311 (704, see FIG. 11). This second gate dielectric layer 312 is different from the first gate dielectric layer 321 and, more particularly, has a different fixed charge content than the first gate dielectric layer 321.

Specifically, the processes 702-704 can comprise depositing a first high-k dielectric material. Next, that first high-k dielectric material is lithographically patterned such that portions above the channel sidewalls 152 are removed (see item 311 in FIG. 10). Then, a second high-k dielectric material that is different from the first high-k material (with a different charge content) is deposited and lithographically patterned such that a portion of this second high-k dielectric material above the channel center portion 151 is removed (see item 312 in FIG. 11). Since the first and second dielectric materials are different and deposited separately, they can also be deposited such that they have different thicknesses (as illustrated), if necessary, to achieve the desired different effective work functions.

Once the first and second gate dielectric layers 311, 312 are formed at process 702-704, a gate conductor layer 321 is formed on both the first gate dielectric layer 311 and on the second gate dielectric layer 312 (706, see FIG. 3). This gate conductor layer 321 can be formed by depositing and, then, lithographically patterning a metal. In the case of an NFET, this metal can comprise an n-type metal or n-type metal alloy, whereas in the case of PFET, this metal can comprise a p-type metal or p-type metal alloy.

Figure 12:
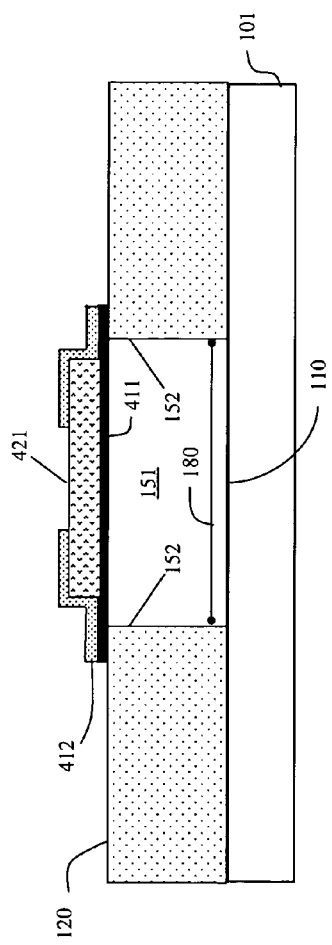
FIG. 12 is a cross-section diagram illustrating a partially completed field effect transistor, as illustrated in FIG. 3.

In another embodiment of the method, a first gate dielectric layer 411 is formed that traverses the width 180 of the designated channel region 150 and further extends laterally beyond the channel sidewalls 152 onto the isolation regions 120 (802, see FIG. 8). Then, a first gate conductor layer 421 is formed on the first gate dielectric layer 411 and, more particularly, just above the center portion 151 of the channel region 150 (804, see FIG. 9). Next, a second gate dielectric layer 412 different from the first gate dielectric layer 411 (i.e., with a different charge content) is formed on the first gate dielectric layer 411 above the channel sidewalls 152 (806, see FIG. 12). Finally, a second gate conductor layer 422 different from the first gate conductor layer 421 is formed on the second gate dielectric layer 412 above the channel sidewalls 152 (808, see FIG. 4).

Specifically, the process 802-808 can comprise depositing a first high-k dielectric material that traverses the width 180 of the designated channel region 150 and further extends laterally beyond the channel sidewalls 152 onto the isolation regions 120 (see item 411 of FIG. 8). Next, a metal can be deposited onto the first high-k dielectric material. In the case of an NFET, this metal can comprise an n-type metal or n-type metal alloy, whereas in the case of PFET, this metal can comprise a p-type metal or p-type metal alloy. This metal is then lithographically patterned such that is remains only above the channel center portion 151, exposing the first high-k dielectric material above the channel sidewalls 152 (see item 421 of FIG. 9). Then, a second high-k dielectric material that is different from the first high-k dielectric material (i.e., that has a different charge content) can be deposited across the exposed first high-k dielectric layer 411 and the metal 421. A portion of the second high-k dielectric material on the previously deposited metal 421 above the channel center portion 151 is removed (i.e., the second high-k dielectric material is lithographically patterned) (see item 412 of FIG. 12). Finally, a second metal, which has a different work function than the previously deposited first metal, is deposited. For example, in the case of an NFET, this second metal can comprise a p-type metal or p-type metal alloy, whereas in the case of PFET, this second metal can comprise an n-type metal or n-type metal alloy (as discussed above). Alternatively, instead of depositing a second metal, a polysilicon material can be deposited. This polysilicon material can be either appropriately doped at deposition or subsequently implanted with appropriate dopants such that it has a different work function than the previously deposited metal. For example, in the case of an NFET, this polysilicon can be doped with a p-type dopant (e.g., boron (B)), whereas in the case of PFET, this polysilicon can be doped with an n-type dopant (e.g., phosphorous (P), arsenic (As) or antimony (Sb)). The second metal (or doped polysilicon) is then lithographically patterned such that it traverses the metal 421 above the channel center portion 151 and further such that it extends laterally beyond the channel sidewalls 152 onto the portion of the gate dielectric layer 211 exposed above the isolation regions 120 (see item 422 of FIG. 4).

Referring again to FIG. 5, after completion of the gate structure 200, 300 or 400 additional processing is performed in order to complete the FET structure. This additional processing includes, but is not limited to, halo implantation, source/drain extension implantation, gate sidewall spacer formation, source/drain implantation, silicide formation, inter-layer dielectric deposition, contact formation, etc.

It should be noted that for the purposes of this disclosure n-type metals or metal alloys are defined as near conduction band metals or metal alloys (e.g., metals or metal alloys within 0.2 eV of the $E_c$ of the semiconductor body 110). Exemplary n-type metals or metal alloys include, but are not limited to, titanium nitride, titanium silicon nitride, tantalum nitride, tantalum silicon nitride, aluminum, silver, hafnium, etc. Contrarily, p-type metals or metal alloys are defined as near valence band metals or metal alloys (e.g., metals or metal alloys within 0.2 eV of the $E_v$ of the semiconductor body 110). Exemplary p-type metals or metal alloys include, but are not limited to, rhenium, rhenium oxide, platinum, ruthenium, ruthenium oxide, nickel, palladium, iridium, etc. It should further be understood that high-k dielectric materials comprise dielectric materials having a dielectric constant "k" above 3.9 (i.e., above the dielectric constant of $SiO_2$). Exemplary high-k dielectric materials include, but are not limited to, hafnium-based materials (e.g., $HfO_2$, HfSiO, HfSiON, or HfAlO) or some other suitable high-k dielectric material (e.g., $Al_2O_3$, $TaO_5$, $ZrO_5$, etc.).

Furthermore, it should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

It should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

Therefore, disclosed above are embodiments of an improved field effect transistor (FET) structure and a method of forming the structure. The FET structure embodiments each incorporate a unique gate structure. Specifically, this gate structure has a first section above a center portion of the FET channel region and second sections above the channel width edges (i.e., above the interfaces between the channel region and adjacent isolation regions). The first and second sections differ (i.e., they have different gate dielectric layers and/or different gate conductor layers) such that they have different effective work functions (i.e., a first and second effective work-function, respectively). The different effective work functions are selected to ensure that the threshold voltage at the channel width edges is elevated.

What is claimed is:

1. A field effect transistor comprising:
a substrate;
a semiconductor body on said substrate, said semiconductor body comprising a channel region with a sidewall, a center portion and an edge portion between said sidewall and said center portion;
an isolation region on said substrate positioned laterally adjacent to said sidewall; and
a gate structure traversing a width of said channel region over said center portion and said edge portion and further extending laterally beyond said sidewall onto said isolation region,
said gate structure comprising a first section above said center portion and a second section above said edge portion and said sidewall,
said first section having a single gate dielectric layer above and immediately adjacent to said center portion and further having a first gate conductor layer above and immediately adjacent to said single gate dielectric layer,
said second section having multiple stacked gate dielectric layers above and immediately adjacent to said edge portion and extending laterally over said sidewall,
said multiple stacked gate dielectric layers comprising an upper gate dielectric layer further extending laterally onto a top surface of said first gate conductor layer,
said second section further having a portion of a second gate conductor layer above and immediately adjacent to said multiple stacked gate dielectric layer such that said first section has a first effective work-function and said second section has a second effective work function that is different from said first effective work-function, and
at least one of said first gate conductor layer and said second gate conductor layer comprising a metal.

2. The field effect transistor according to claim 1, said first section having said first effective work-function and said second section having said second effective work function such that a second threshold voltage at said sidewall is at least equal to a first threshold voltage at said center portion.

3. The field effect transistor according to claim 1, said first gate conductor layer comprising a first metal and said second gate conductor layer comprising a second metal different from said first metal.

4. The field effect transistor according to claim 1, said second gate conductor layer further having another portion that is above and immediately adjacent to said first gate conductor layer.

5. The field effect transistor according to claim 1, said first gate conductor layer comprising said metal and said second gate conductor layer comprising a doped polysilicon.

* * * * *